United States Patent
Lim et al.

(10) Patent No.: US 10,236,417 B2
(45) Date of Patent: Mar. 19, 2019

(54) LIGHT-EMITTING ELEMENT

(71) Applicant: LG INNOTEK CO., LTD., Seoul (KR)

(72) Inventors: Woo Sik Lim, Seoul (KR); Min Sung Kim, Seoul (KR); Eun Woo Ro, Seoul (KR); Su Ik Park, Seoul (KR); Youn Joon Sung, Seoul (KR); Kwang Yong Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 7 days.

(21) Appl. No.: 15/563,737

(22) PCT Filed: Mar. 31, 2016

(86) PCT No.: PCT/KR2016/003346
§ 371 (c)(1),
(2) Date: Oct. 2, 2017

(87) PCT Pub. No.: WO2016/159694
PCT Pub. Date: Oct. 6, 2016

(65) Prior Publication Data
US 2018/0083165 A1   Mar. 22, 2018

(30) Foreign Application Priority Data
Apr. 3, 2015  (KR) .................. 10-2015-0047506

(51) Int. Cl.
*H01L 33/00*  (2010.01)
*H01L 33/38*  (2010.01)
(Continued)

(52) U.S. Cl.
CPC ............ *H01L 33/382* (2013.01); *H01L 33/36* (2013.01); *H01L 33/44* (2013.01); *H01L 33/62* (2013.01);
(Continued)

(58) Field of Classification Search
None
See application file for complete search history.

(56) References Cited

U.S. PATENT DOCUMENTS

| 2008/0087902 | A1 | 4/2008 | Lee et al. |
| 2011/0210345 | A1* | 9/2011 | Lim .................. H01L 33/20 |
| | | | 257/88 |

(Continued)

FOREIGN PATENT DOCUMENTS

| JP | 2012-244165 A | 12/2012 |
| JP | 2013-243254 A | 12/2013 |

(Continued)

*Primary Examiner* — Calvin Y Choi
(74) *Attorney, Agent, or Firm* — Birch, Stewart, Kolasch & Birch, LLP

(57) ABSTRACT

An embodiment relates to a light-emitting element that easily dissipates heat through a pad and has a uniform heat distribution, the light-emitting element including a light-emitting structure that includes a first semiconductor layer, an active layer, and a second semiconductor layer; a first electrode that is formed on one side of the light-emitting structure and includes a plurality of contact parts electrically connected with the first semiconductor layer; a second electrode formed on the one side of the light-emitting structure and electrically connected with the second semiconductor layer; a first pad connected with the first electrode; and a second pad spaced apart from the first pad and connected with the second electrode, wherein the plurality of contact parts are arranged on the first and second pads.

14 Claims, 16 Drawing Sheets

(51) Int. Cl.
  *H01L 33/36*    (2010.01)
  *H01L 33/44*    (2010.01)
  *H01L 33/62*    (2010.01)
  *H01L 33/64*    (2010.01)
  *F21V 8/00*    (2006.01)
  *H01L 33/06*    (2010.01)
  *H01L 33/32*    (2010.01)
  *H01L 33/60*    (2010.01)

(52) U.S. Cl.
  CPC .......... *H01L 33/647* (2013.01); *G02B 6/0053* (2013.01); *G02B 6/0055* (2013.01); *G02B 6/0088* (2013.01); *H01L 33/06* (2013.01); *H01L 33/32* (2013.01); *H01L 33/60* (2013.01)

(56) References Cited

U.S. PATENT DOCUMENTS

| | | |
|---|---|---|
| 2012/0007101 A1 | 1/2012 | Yang et al. |
| 2014/0367637 A1* | 12/2014 | Choi ................. H01L 33/22 |
| | | 257/13 |
| 2015/0054021 A1* | 2/2015 | Yeh ................. H01L 25/0753 |
| | | 257/99 |

FOREIGN PATENT DOCUMENTS

| | | |
|---|---|---|
| KR | 10-2011-0074506 A | 6/2011 |
| KR | 10-2012-0138725 A | 12/2012 |
| KR | 10-2013-0111792 A | 10/2013 |

\* cited by examiner

【FIG. 1a】
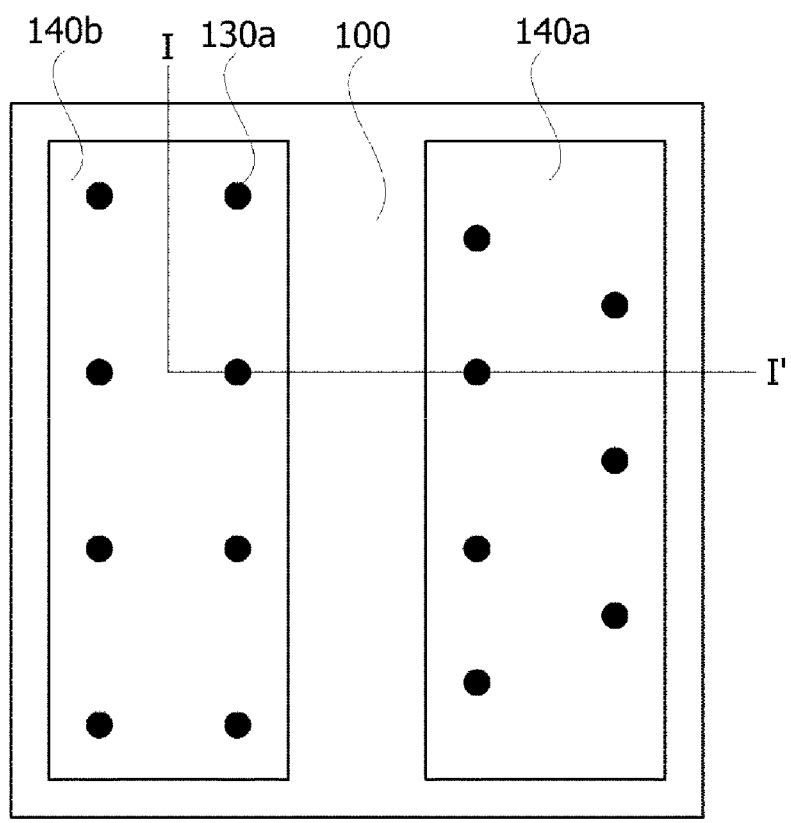

[FIG. 1b]
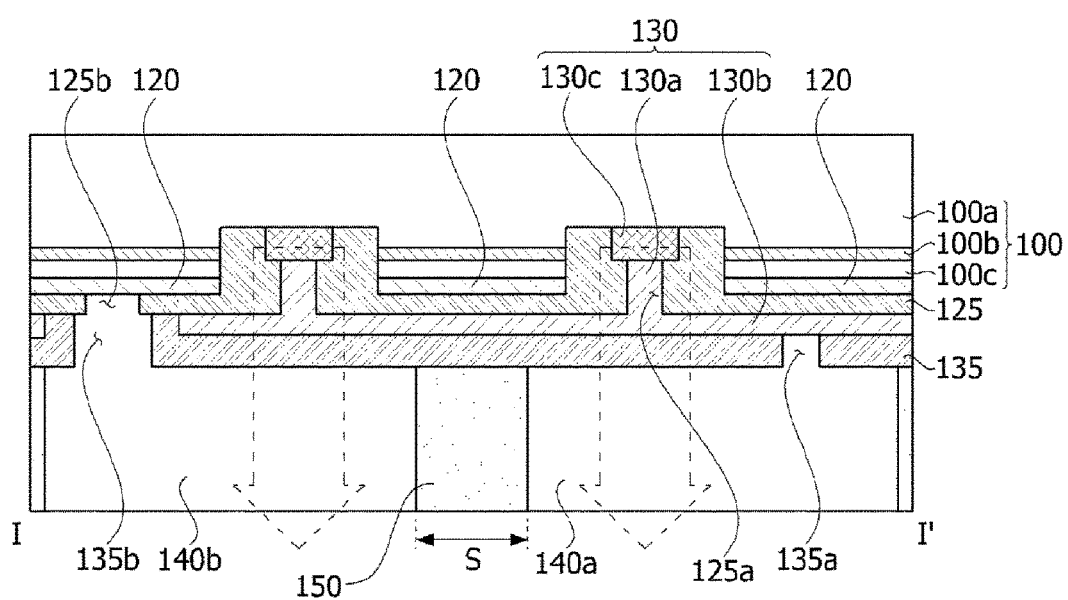

【FIG. 2a】
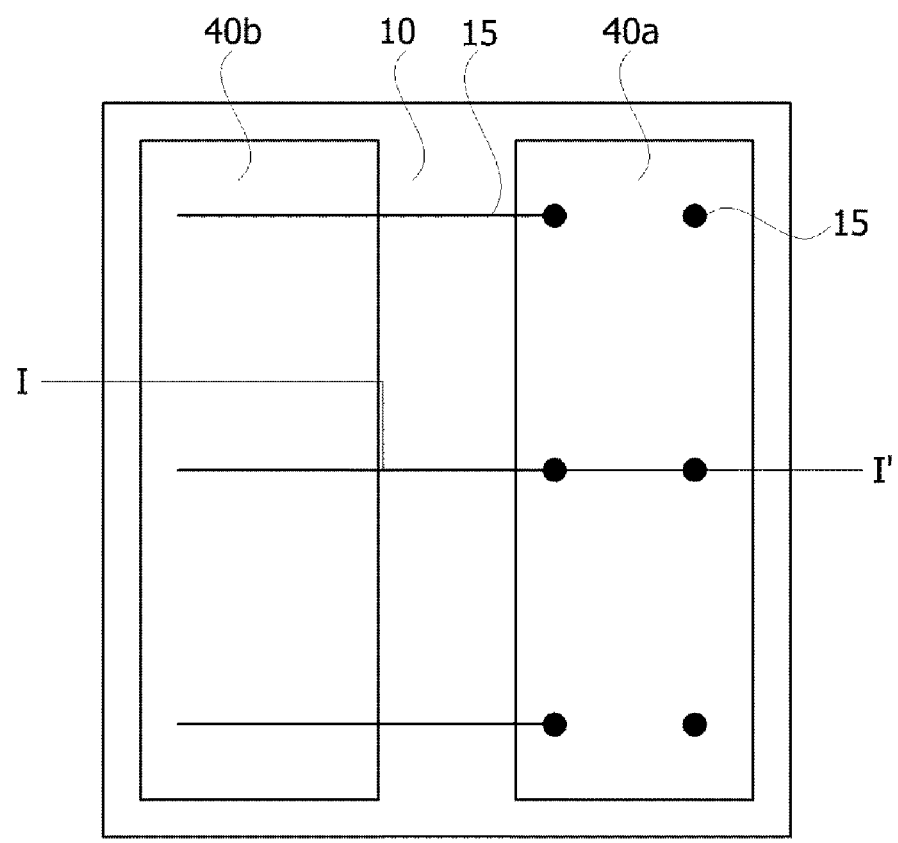

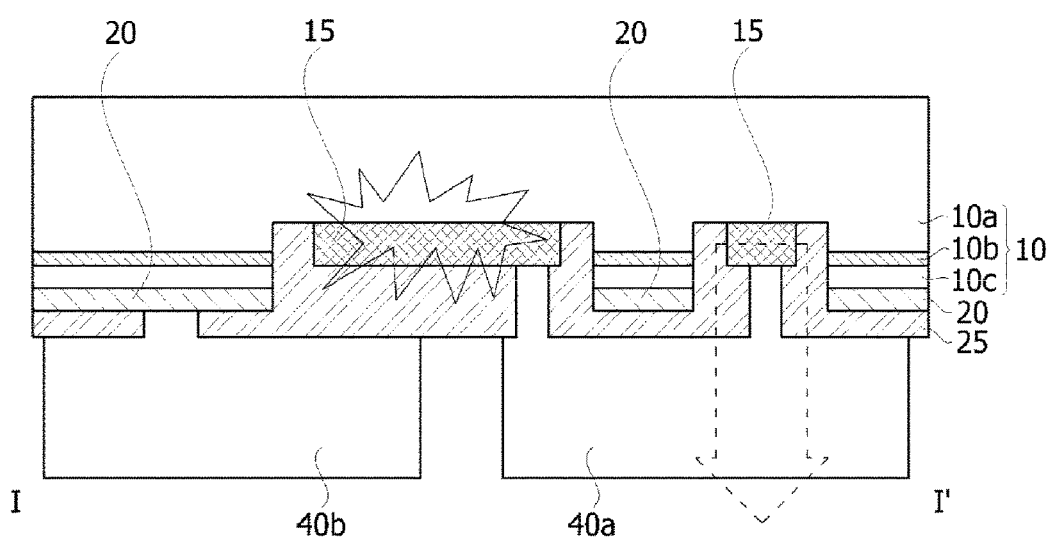
[FIG. 2b]

[FIG. 3]
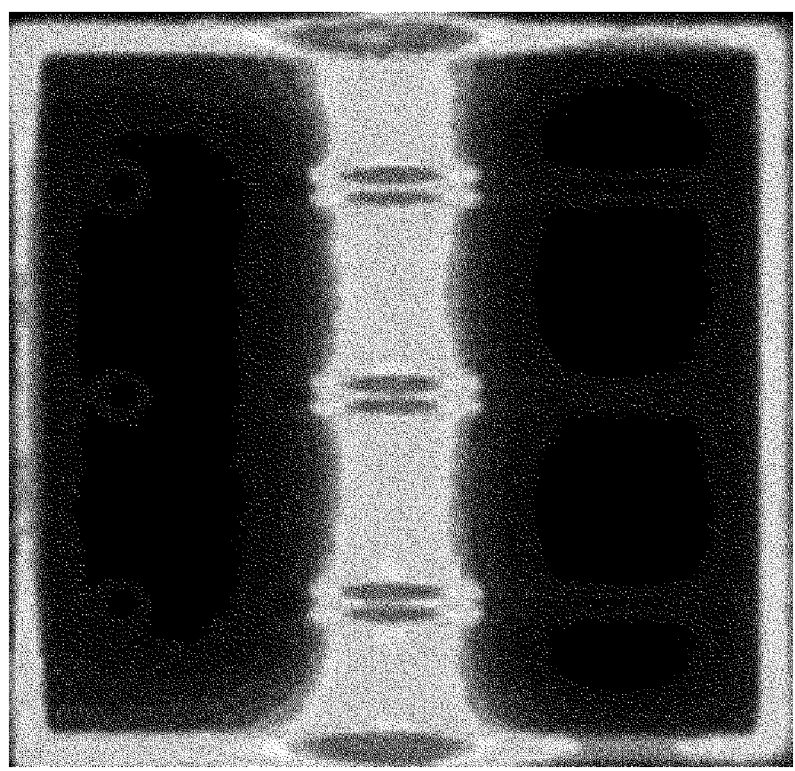

[FIG. 4]
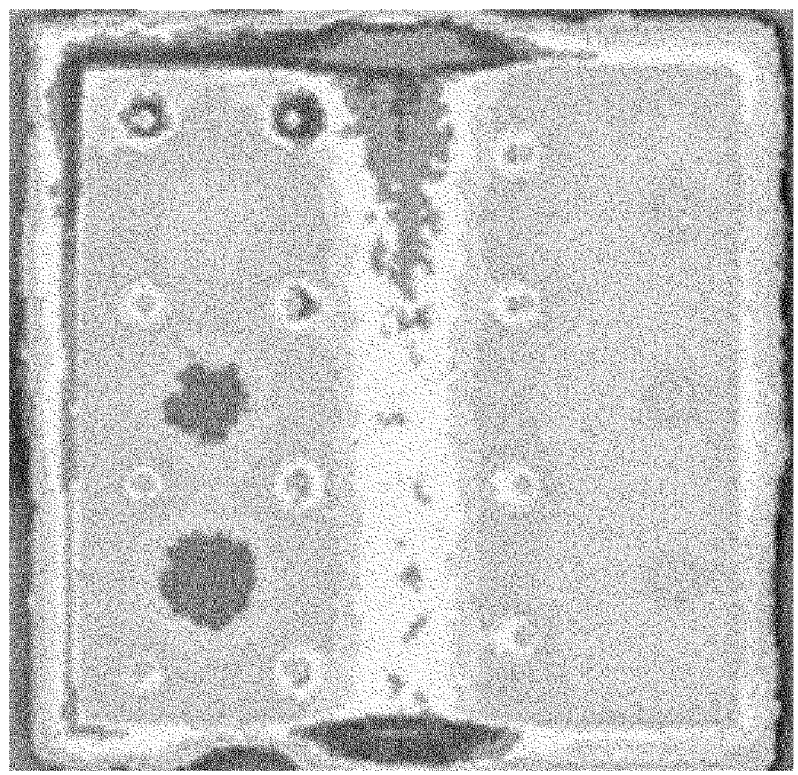

【FIG. 5a】
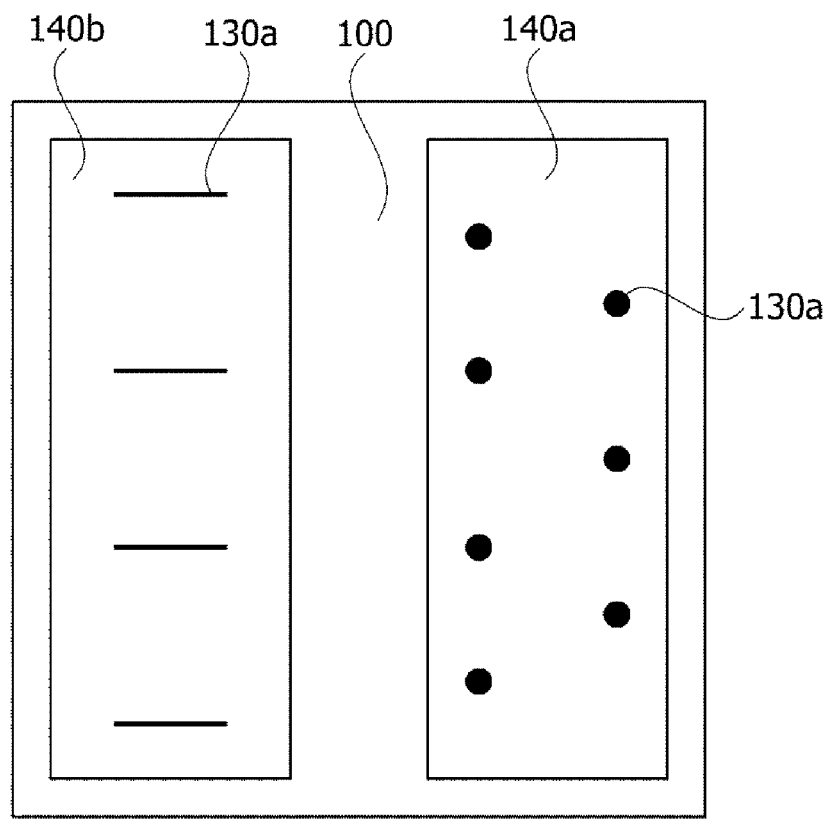

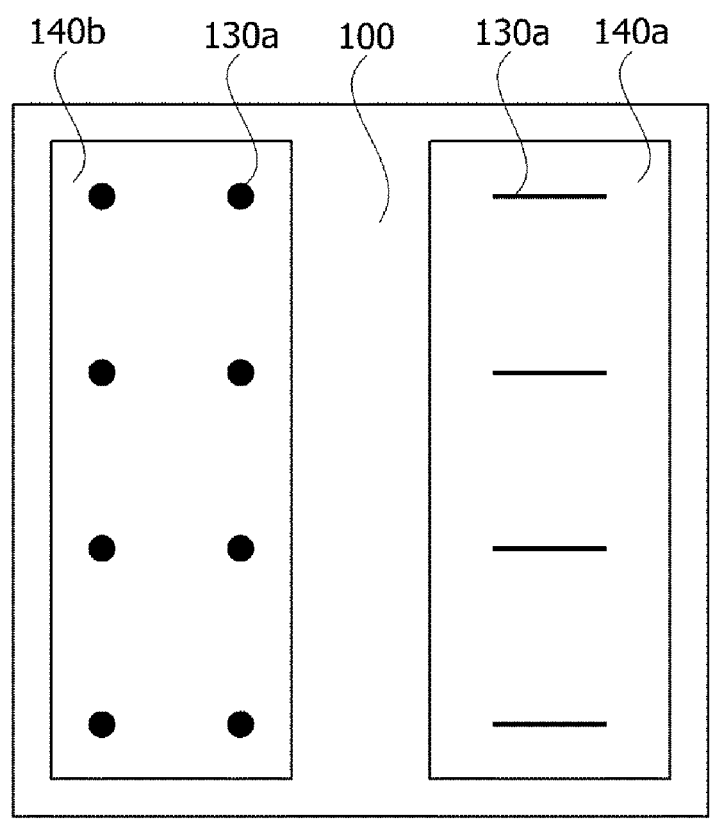
【FIG. 5b】

【FIG. 5c】
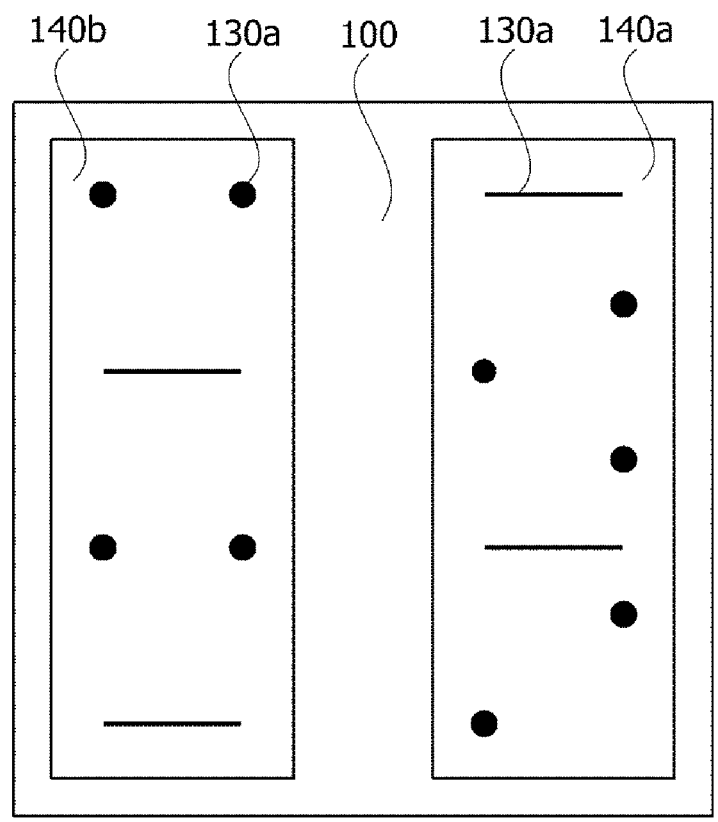

[FIG. 6a]
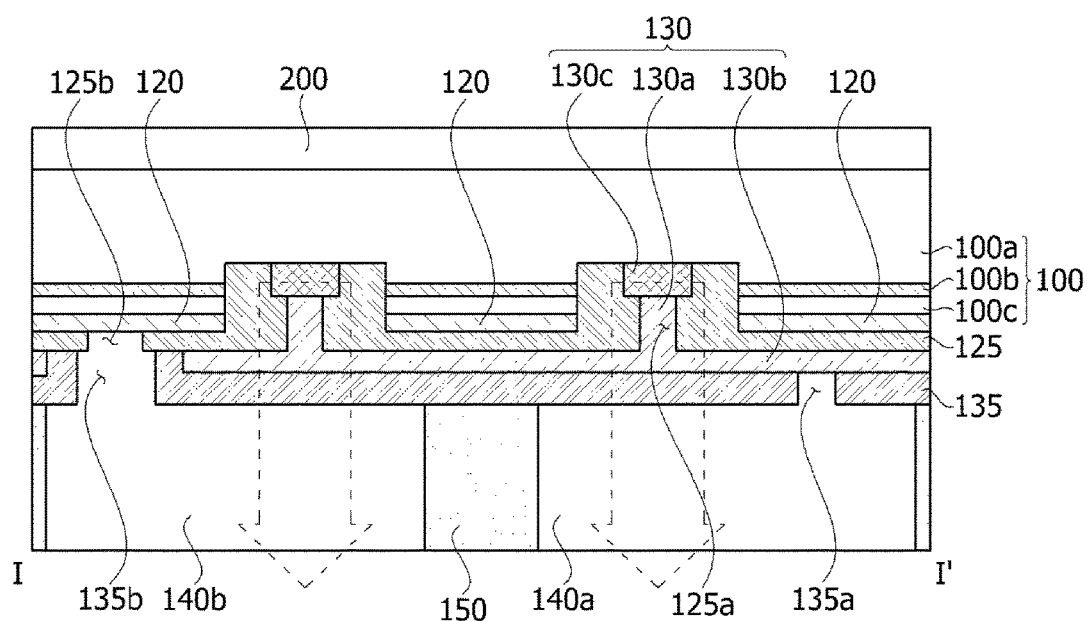

[FIG. 6b]
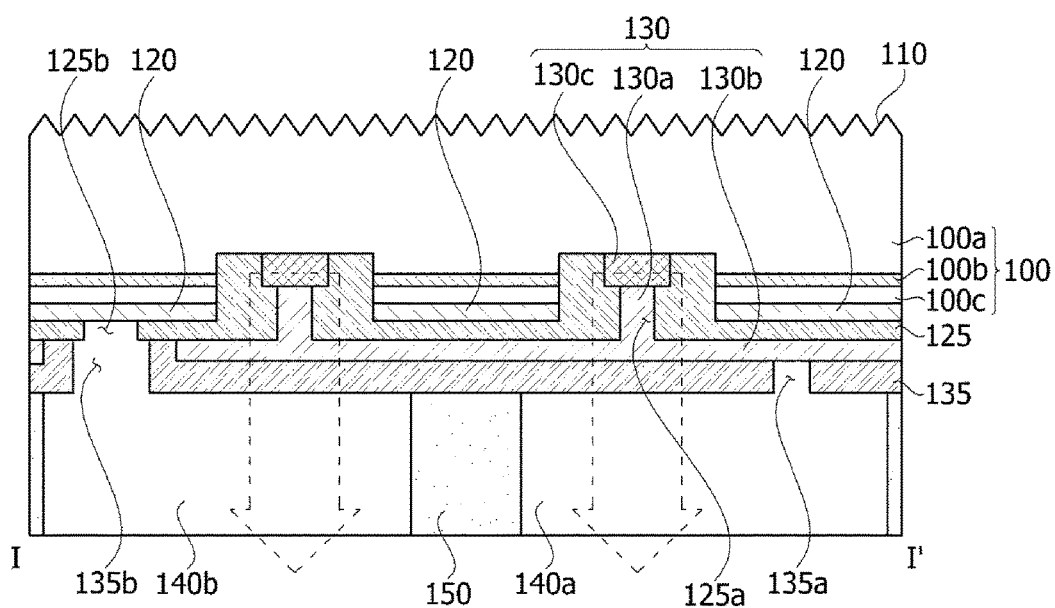

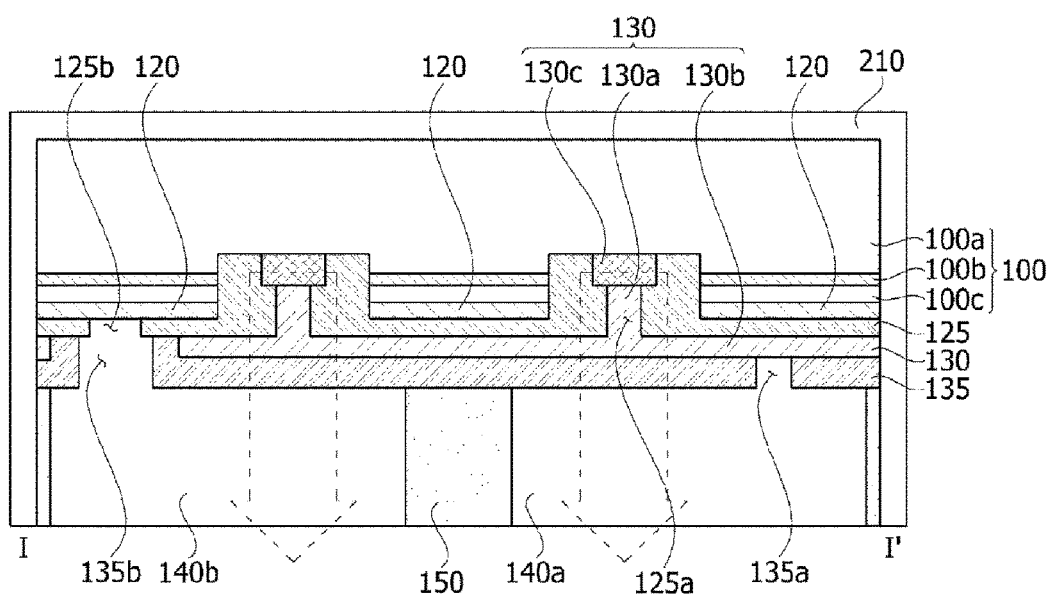
[FIG. 6c]

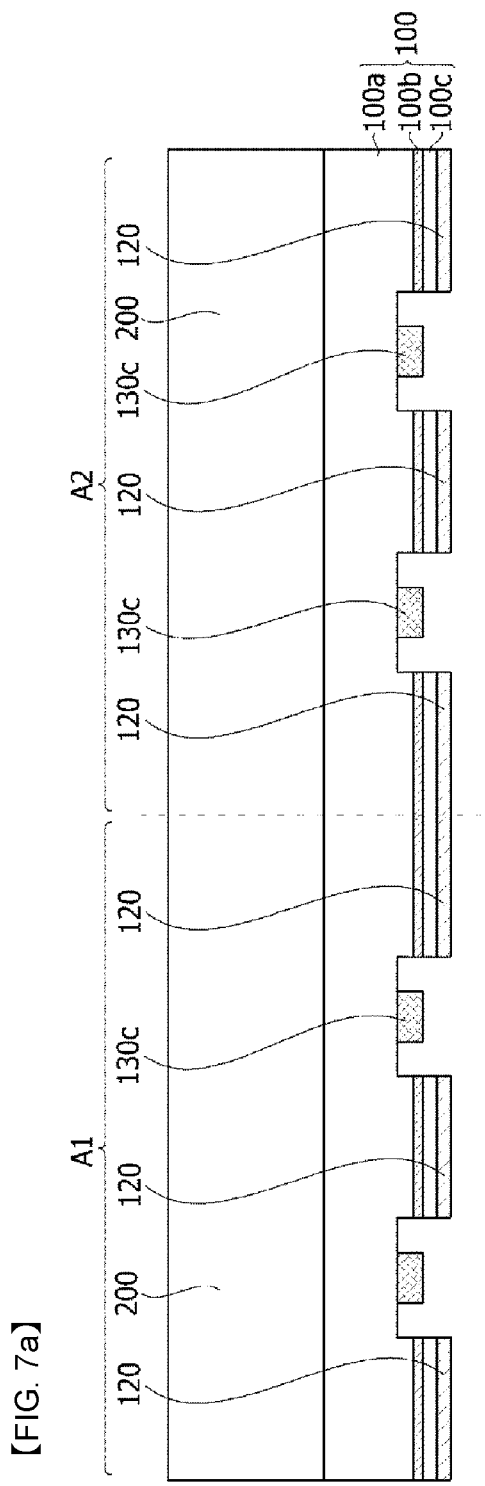
[FIG. 7a]

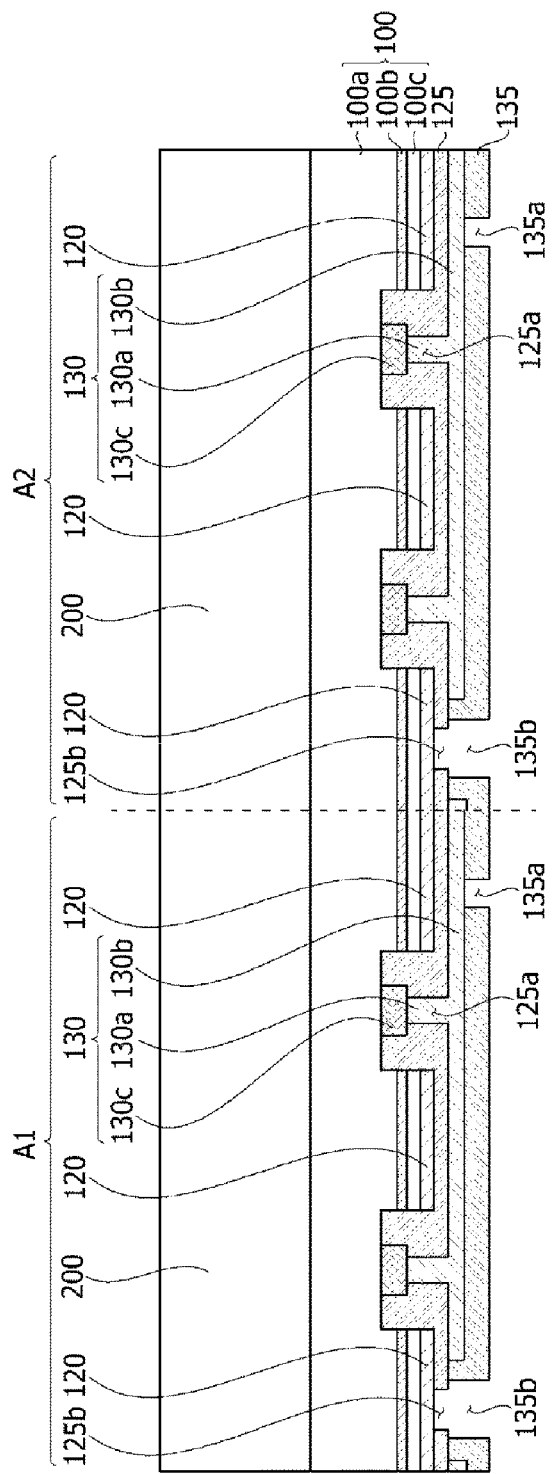

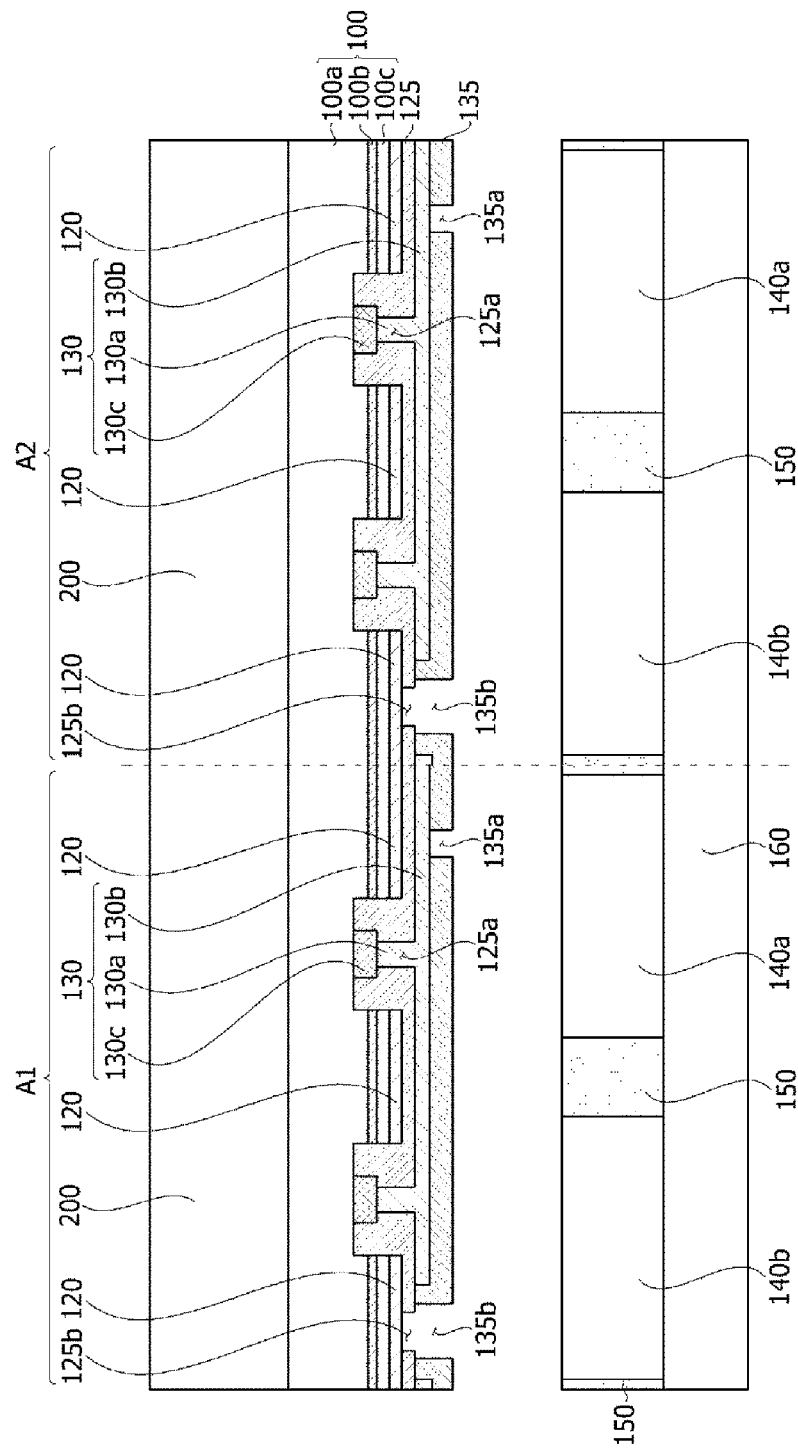
[FIG. 7c]

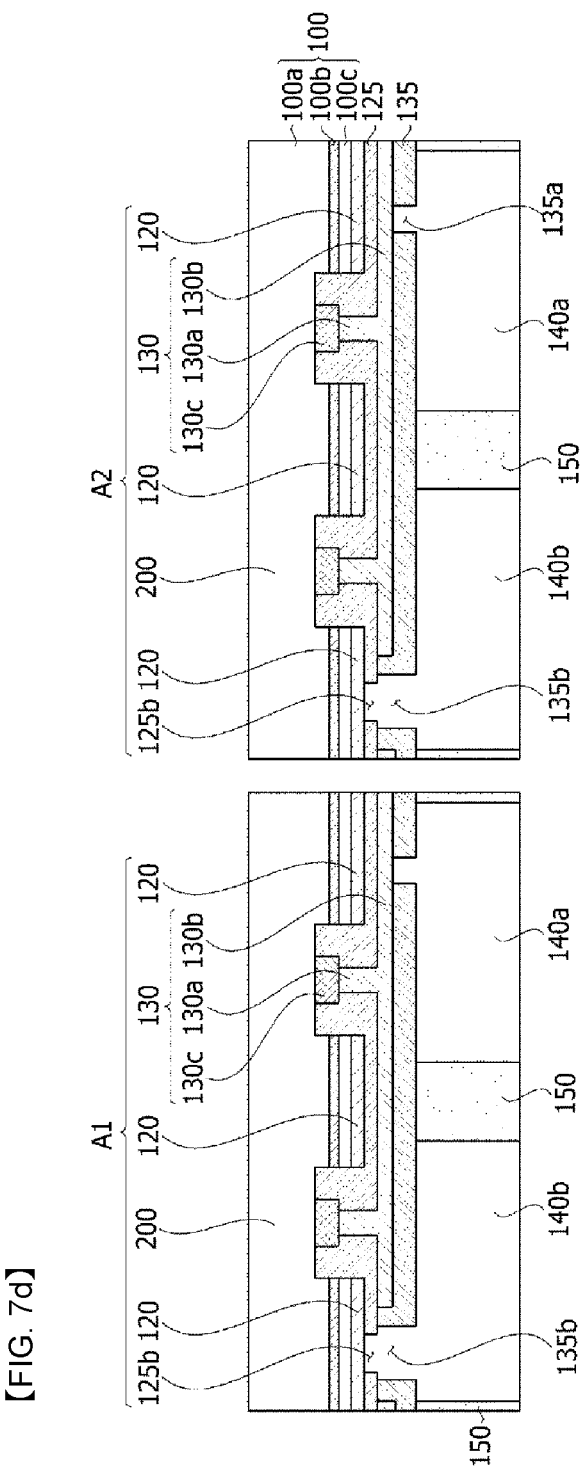
[FIG. 7d]

LIGHT-EMITTING ELEMENT

CROSS REFERENCE TO RELATED APPLICATIONS

This application is the National Phase of PCT International Application No. PCT/KR2016/003346, filed on Mar. 31, 2016, which claims priority under 35 U.S.C. 119(a) to Patent Application No. 10-2015-0047506, filed in the Republic of Korea on Apr. 3, 2015, all of which are hereby expressly incorporated by reference into the present application.

TECHNICAL FIELD

Embodiments relate to a light-emitting element.

BACKGROUND ART

A light-emitting diode (LED) is one of light-emitting elements which emit light when current is supplied thereto. The LED is capable of emitting high-efficient light at a low voltage and may thus bring an excellent energy saving effect.

Recently, luminance problems of the LED have been significantly improved and thus the LED has been applied to various types of devices such as a backlight unit of a liquid crystal display device, an electric sign, a display device, and home appliances.

The LED may have a structure in which an N type electrode and a P type electrode are arranged at a side of a light-emitting structure including an N type semiconductor layer, an active layer, and a P type semiconductor layer.

However, the LED has problems that heat generated in an interfacial region between the electrodes and the light-emitting structure is not quickly discharged to the outside and that a heat distribution may not be uniform.

DISCLOSURE

Technical Problem

Embodiments provide a light-emitting element capable of easily dissipating heat and achieving high thermal reliability.

Technical Solution

A light-emitting element according to an embodiment includes a light-emitting structure including a first semiconductor layer, an active layer, and a second semiconductor layer; a first electrode formed at a side of the light-emitting structure and including a plurality of contact parts electrically connected to the first semiconductor layer; a second electrode formed at the side of the light-emitting structure and electrically connected to the second semiconductor layer; a first pad connected to the first electrode; and a second pad connected to the second electrode to be spaced from the first pad. The plurality of contact parts are arranged on the first pad and the second pad.

Advantageous Effects

According to an embodiment, thermal reliability of a light-emitting element may be improved since heat generated in an interfacial region between a first electrode and a light-emitting structure may be easily discharged via a first pad and a second pad.

Furthermore, the heat generated in the interfacial region between the light-emitting structure and the first electrode may be dispersed to an extension part connected to the first electrode and thus an even heat distribution may be achieved.

DESCRIPTION OF DRAWINGS

FIG. 1A is a plan view of a lower part of a light-emitting element according to an embodiment.

FIG. 1B is a cross-sectional view taken along line I-I' of FIG. 1A.

FIG. 2A is a plan view of a lower part of a general light-emitting element.

FIG. 2B is a cross-sectional view taken along line I-I' of FIG. 2A.

FIG. 3 is a photograph of a distribution of heat generated in the light-emitting element of FIG. 1A.

FIG. 4 is a photograph of a distribution of heat generated in the general light-emitting element of FIG. 2A.

FIGS. 5A to 5C are plan views illustrating various embodiments of contact parts of FIG. 1A.

FIGS. 6A to 6C are cross-sectional views of light-emitting elements according to other embodiments.

FIGS. 7A to 7D are cross-sectional views illustrating a method of manufacturing a light-emitting element according to an embodiment.

MODES OF THE INVENTION

Various changes may be made in the present invention and the present invention may be implemented in various embodiments. Thus, exemplary embodiments will be illustrated in the drawings and described herein. However, the present invention is not limited thereto and should be understood to cover all modifications, equivalents, and alternatives falling within the idea and scope of embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of embodiments. As used here, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprise," "comprising," "include" and/or "including," when used herein, specify the presence of stated features, integers, steps, operations, elements, and/or components, but do not preclude the presence or addition of one or more other features, integers, steps, operations, elements, components, and/or groups thereof.

When embodiments are described below, when an element is referred to as being "on or under" another element, it should be understand to mean that the two elements are in direct contact with each other or are in indirect contact with each other while one or more elements are interposed therebetween. It should be also understood to mean that one of the two elements is located above or below the other element.

Hereinafter, embodiments will be described in detail with reference to the accompanying drawings, in which the same or corresponding elements are represented by the same reference numerals regardless of a drawing number and are not redundantly described herein.

A light-emitting element according to an embodiment will be described in detail with reference to the accompanying drawings below.

FIG. 1A is a plan view of a lower part of a light-emitting element according to an embodiment. FIG. 1B is a cross-sectional view taken along line I-I' of FIG. 1A. FIG. 2A is a plan view of a lower part of a general light-emitting element. FIG. 2B is a cross-sectional view taken along line I-I' of FIG. 2A. FIG. 3 is a photograph of a distribution of heat generated in the light-emitting element of FIG. 1A. FIG. 4 is a photograph of a distribution of heat generated in the general light-emitting element of FIG. 2A.

As illustrated in FIGS. 1A and 1B, the light-emitting element according to an embodiment includes a light-emitting structure 100 including a first semiconductor layer 100a, a second semiconductor layer 100c, and an active layer 100b, a first electrode 130 formed on a lower surface of the first semiconductor layer 100a, a second electrode 120 formed on a lower surface of the second semiconductor layer 100c, a first pad 140a connected to the first electrode 130, and a second pad 140b connected to the second electrode 120.

The first electrode 130 is connected to the first semiconductor layer 100a. The first electrode 130 is connected to the first semiconductor layer 100a in one or more regions. When the first electrode 130 is connected to the first semiconductor layer 100a in a plurality of regions, the first electrode 130 may include a plurality of contact parts 130a which are in contact with the first semiconductor layer 100a, and an extension part 130b connecting the plurality of contact parts 130a.

The plurality of contact parts 130a are electrically connected to the first pad 140a through the extension part 130b. The plurality of contact parts 130a and the extension part 130b may be integrally formed but the structures thereof are not limited thereto. For example, the first electrode 130 may further include a contact electrode 130c located between the first semiconductor layer 100a and the plurality of contact parts 130a to make ohmic contact.

One or more second electrodes 120 may be formed on the lower surface of the second semiconductor layer 100c such that they may be connected to one another. The second electrode 120 is electrically connected to the second pad 140b.

The light-emitting structure 100 includes the first semiconductor layer 100a, the active layer 100b, and the second semiconductor layer 100c. A light-emitting wavelength band of the light-emitting structure 100 is not limited. For example, light emitted from the light-emitting structure 100 may be in an ultraviolet wavelength band, a visible-light wavelength band, or an infrared wavelength band. Light having a desired light-emitting wavelength band may be generated by appropriately controlling the components on each layer of the light-emitting element.

The first semiconductor layer 100a may be embodied as a III-V group compound semiconductor, a II-VI group compound semiconductor, or the like, and may be doped with a first dopant. The first semiconductor layer 100a may be formed of, but is not limited to, at least one material selected from among a semiconductor material having an empirical formula of AlxInyGa(1-x-y)N ($0 \leq x \leq 1$, $0 \leq y \leq 1$, $0 \leq x \pm y \leq 1$), InAlGaN, AlGaAs, GaP, GaAs, GaAsP, and AlGaInP. When the first dopant is an n type dopant such as Si, Ge, Sn, Se, or Te, the first semiconductor layer 100a doped with the first dopant may be an n type semiconductor layer.

Although the first semiconductor layer 100a which is a single layer is illustrated in the drawings, the first semiconductor layer 100a may have a multilayer structure. When the first semiconductor layer 100a has the multilayer structure, the first semiconductor layer 100a may include an undoped semiconductor layer (not shown). The undoped semiconductor layer is a layer formed to enhance the crystallinity of the first semiconductor layer 100a. The undoped semiconductor layer is not doped with the first dopant and thus may have low electrical conductivity than that of the first semiconductor layer 100a.

The active layer 100b is a layer at which electrons (or holes) injected via the first semiconductor layer 100a and holes (or electrons) injected via the second semiconductor layer 100c meet. The active layer 100b is changed to a lower energy level as the electrons and the holes are recombined with each other, and generates light having a wavelength corresponding to the lower energy level.

The active layer 100b may have, but is not limited to, a single well structure, a multi-well structure, a single quantum well structure, a multi-quantum well (MQW) structure, a quantum dot structure, or a quantum wire structure.

When the active layer 100b is formed in a well structure, a well layer/barrier layer thereof may have a pair structure including at least one selected from among InGaN/GaN, InGaN/InGaN, GaN/AlGaN, InAlGaN/GaN, GaAs(In-GaAs)/AlGaAs, and GaP(InGaP)/AlGaP but is not limited thereto. The well layer may be formed of a material having a band gap smaller than that of the barrier layer.

The second semiconductor layer 100c may be embodied as a III-V group compound semiconductor, a II-VI group compound semiconductor, or the like. The second semiconductor layer 100c may be doped with a second dopant. The second semiconductor layer 100c may be formed of a material selected from among a semiconductor material having an empirical formula of InxAlyGa1-x-yN ($0 \leq x \leq 1$, $0 \leq y \leq 1$, $0 \leq x+y \leq 1$), AlInN, AlGaAs, GaP, GaAs, GaAsP, and AlGaInP. When the second dopant is a p type dopant such as Mg, Zn, Ca, Sr, or Ba, the second semiconductor layer 100c doped with the second dopant may be a p type semiconductor layer.

In one embodiment, the light-emitting structure 100 may include the first semiconductor layer 100a which is an n type semiconductor layer and the second semiconductor layer 100c which is a p type semiconductor layer, or may include the first semiconductor layer 100a which is a p type semiconductor layer and the second semiconductor layer 100c which is an n type semiconductor layer. Alternatively, the light-emitting structure 100 may have a structure in which an n type or p type semiconductor layer is further formed between the second semiconductor layer 100c and the active layer 100b. That is, the light-emitting structure 100 according to an embodiment may be formed in at least one structure selected from among an np junction structure, a pn junction structure, an npn junction structure, and a pnp junction structure. In one embodiment, the light-emitting structure 100 may have various structures including an n type semiconductor layer and a p type semiconductor layer.

The concentration of impurities doped in the first semiconductor layer 100a and the second semiconductor layer 100c may be uniform or may not be uniform. That is, the light-emitting structure 100 may have various doped structures and is not limited thereto.

The first electrode 130 is in contact with the first semiconductor layer 100a via a first contact hole 125a formed in the first semiconductor layer 100a, the active layer 100b, and the second semiconductor layer 100c.

The second electrode 120 is formed on the lower surface of the second semiconductor layer 100c. The second electrode 120 may be formed on the entire lower surface of the second semiconductor layer 100c but an interfacial area between the second electrode 120 and the second semiconductor layer 100c is not limited thereto. The second electrode 120 is electrically connected to the second semiconductor layer 100c at the lower surface of the second semiconductor layer 100c.

The first electrode 130 and the second electrode 120 may be formed of a transparent conductive oxide (TCO) film. The TCO film may be selected from among an indium tin oxide (ITO), an indium zinc oxide (IZO), an aluminum zinc oxide (AZO), an aluminum gallium zinc oxide (AGZO), an indium zinc tin oxide (IZTO), an indium aluminum zinc oxide (IAZO), an indium gallium zinc oxide (IGZO), an indium gallium tin oxide (IGTO), an antimony tin oxide (ATO), a gallium zinc oxide (GZO), an IZO nitride (IZON), ZnO, IrOx, RuOx, NiO, and the like.

Alternatively, the first electrode 130 and the second electrode 120 may be formed of a non-transparent metal such as Ag, Ni, Al, Rh, Pd, Ir, Ru, Mg, Zn, Pt, Au, or Hf, or be formed of one or more layers which are a combination of a transparent conductive oxide film and a non-transparent metal, but are not limited thereto. When the second electrode 120 is formed of a metal having high reflectivity, light generated by the active layer 100b may be reflected from the second electrode 120, pass through the first semiconductor layer 100a, and be then effectively discharged to the outside.

When the first electrode 130 further includes the contact electrode 130c, the contact electrode 130c may be formed of a metal having lower contact resistance with respect to the first semiconductor layer 100a than the plurality of contact parts 130a and the extension part 130b or may be formed of the same material as those of the plurality of contact parts 130a and the extension part 130b. However, the material of the contact electrode 130c is not limited thereto.

Although not shown, the second electrode 120 may further include a material making ohmic contact with the second semiconductor layer 100c. In this case, the material making ohmic contact may include at least one material selected from among the transparent conductive oxide film described above, Pt, Ag, and Ti but is not limited thereto.

The first insulating layer 125 is formed on a side surface and/or a lower surface of the light-emitting structure 100. The first insulating layer 125 includes the first contact hole 125a partially exposing the contact electrode 130c and a second contact hole 125b partially exposing the second electrode 120. For example, when the first electrode 130 is in direct contact with the first semiconductor layer 100a, the first insulating layer 125 may partially expose the first semiconductor layer 100a.

The first contact hole 125a is formed to connect the plurality of contact parts 130a and the contact electrode 130c while passing through the first insulating layer 125. The second contact hole 125b is formed to connect the second electrode 120 and the second pad 140b while passing through the first insulating layer 125.

The first insulating layer 125 may be formed of a transparent material or a non-transparent material. Alternatively, the first insulating layer 125 may include an oxide or a nitride. The first insulating layer 125 may be formed of a material selected from the group consisting of $SiO_2$, $Si_xO_y$, $Si_3N_4$, $Si_xN_y$, $SiO_xN_y$, $Al_2O_3$, $TiO_2$, AlN, and the like.

The extension part 130b may have a thickness which is less than that of the contact electrode 130c to easily discharge heat generated in the light-emitting structure 100 but is not limited thereto. The extension part 130b may be formed in all regions excluding the second contact hole 125b but is not limited thereto.

The second insulating layer 135 is located on lower surfaces of the first electrode 130 and the second electrode 120. In detail, the second insulating layer 135 may be located between the first electrode 130 and the second pad 140b to prevent the first electrode 130 and the second pad 140b from being in contact with each other.

The second insulating layer 135 may be formed of a transparent material or a non-transparent material. Alternatively, the second insulating layer 135 may include an oxide or a nitride. The second insulating layer 135 may be formed of at least one material selected from the group consisting of $SiO_2$, $Si_xO_y$, $Si_3N_4$, $Si_xN_y$, $SiO_xN_y$, $Al_2O_3$, $TiO_2$, AlN, and the like. The second insulating layer 135 may be formed of the same material as that of the first insulating layer 125 but is not limited thereto.

The second insulating layer 135 includes a third contact hole 135a partially exposing the extension part 130b, and a fourth contact hole 135b exposing a region corresponding to the second contact hole 125b of the first insulating layer 125. Thus, the lower surface of the second electrode 120 is exposed through the second contact hole 125b and the fourth contact hole 135b which overlap each other. The extension part 130b of the first electrode 130 may be exposed via the third contact hole 135a.

The first pad 140a and the extension part 130b are connected via the third contact hole 135a passing through the second insulating layer 135. The second pad 140b and the second electrode 120 are connected via the second contact hole 125b and the fourth contact hole 135b. Although not shown, a bonding layer may further be formed between the first pad 140a and the extension part 130b and between the second pad 140b and the second electrode 120.

The bonding layer may bond the first pad 140a and the extension part 130b and bond the second pad 140b and the second electrode 120 by eutectic bonding, welding bonding, or diffusion bonding. In this case, the bonding layer may be in a solid state and be formed of a material having electrical conductivity but is not limited thereto.

The first pad 140a and the second pad 140b may be provided on a lower surface of the second insulating layer 135. A filling layer 150 may be further formed in an isolation section between the first pad 140a and the second pad 140b. The filling layer 150 may be formed of a material having an insulating property such as resin but is not limited thereto.

Since the plurality of contact parts 130a are electrically connected by the extension part 130b, current may be smoothly supplied from the first pad 140a to the plurality of contact parts 130a via the extension part 130b.

The plurality of contact parts 130a of the first electrode 130 may be formed only in a region overlapping with the first pad 140a and the second pad 140b. Current may be concentrated in the plurality of contact parts 130a and thus relatively high heat is generated therein. Thus, when the plurality of contact parts 130a are provided on the pads 140a and 140b, a heat pass path may be shortened to increase heat dissipation efficiency.

The heat dissipation efficiency may be more increased when all cross-sectional areas of the plurality of contact parts 130a overlap with the first pad 140a and the second pad 140b), when viewed from a plan view of the light-emitting element. In this case, the plurality of contact parts 130a are not provided in a region or regions between the first pad 140a and the second pad 140b (offset arrangement), when viewed from the plan view. Here, the term "plan view" may be defined as an image obtained when a top view of the light-emitting element is projected on a two-dimensional (2D) plane.

Referring to FIGS. 2A and 2B, a first electrode 15 which is in contact with a first semiconductor layer 10a may be formed between a first pad 40a and a second pad 40b.

However, in this structure, when heat is generated in an interfacial region between the first electrode 15 and a light-emitting structure 10, heat generated in a region which does not overlap with the first pad 40a and the second pad 40b is not quickly discharged below the region and is discharged via the first pad 40a and the second pad 40b. That is, a heat pass path is long. Accordingly, heat generated in the light-emitting element cannot be efficiently discharged and thus thermal reliability is very low.

Referring to FIG. 3, in a light-emitting element according to an embodiment, a temperature gradient between a temperature between a first pad and a second pad and a temperature in the remaining regions is not high.

This is because a contact part of a first electrode entirely overlaps with the first and second pads and thus heat generated in an interfacial region between a first semiconductor layer and the first electrode is quickly discharged via the first and second pads below the first semiconductor layer and the first electrode. This is also because no contact part is arranged in a region between the first and second pads. Accordingly, the light-emitting element according to an embodiment has a uniform heat distribution and thus thermal reliability thereof is high.

In contrast, referring to FIG. 4, in a light-emitting element having a structure as illustrated in FIG. 2A, a temperature gradient between a temperature between a first pad and a second pad and a temperature in the remaining regions is very high.

This is because an interfacial region between a first semiconductor layer and a first electrode does not overlap with the first pad and the second pad. Thus, since heat generated between the first pad and the second pad is difficult to be discharged, a heat distribution is not uniform and thermal reliability is lower than that of the light-emitting element according to an embodiment.

FIGS. 5A to 5C are plan views illustrating various embodiments of contact parts such as those of FIG. 1A.

As illustrated in FIGS. 5A to 5C, a plurality of contact parts 130a may have various cross-sectional shapes within a range in which they overlap with pads 140a and 140b. For example, cross-sectional areas of some contact parts 130a may be in the form of dots or lines. Alternatively, cross-sectional areas of some contact parts 130a may be in the form of dots and lines. An interfacial area between the plurality of contact parts 130a and the light-emitting structure 100 may be variously changed according to a degree of concentration of current in the light-emitting structure 100.

FIGS. 6A to 6C are cross-sectional views of light-emitting elements according to other embodiments.

Generally, in order to manufacture a thin-film light-emitting element, in a thin-film flip chip (TFFC) structure, a light-emitting structure 100 is formed on a substrate 200 and then the substrate 200 is removed. A light-emitting element according to another embodiment may have a general flip chip structure in which the substrate 200 is not removed from an upper surface of the light-emitting structure 100, as illustrated in FIG. 6A. In the light-emitting element having the general flip chip structure of FIG. 6A, a filling layer 150 may not be formed between a first pad 140a and a second pad 140b.

The substrate 200 is formed of a material allowing light to pass therethrough. The substrate 200 may be formed of a material having high thermal conductivity and may be an insulating substrate. The substrate 200 may be formed of sapphire (Al2O3), GaN, ZnO, or AlO but is not limited thereto. Although not shown, irregularities may be formed between the substrate 200 and the light-emitting structure 100 to improve light extraction efficiency.

Although not shown, a buffer layer may be further formed between the light-emitting structure 100 and the substrate 200. The buffer layer may lessen lattice mismatching between the light-emitting structure 100 and the substrate 200. The buffer layer may have a form in which a III-group element and a V-group element are bound to each other, be formed of GaN, InN, AlN, InGaN, AlGaN, InAlGaN, or AlInN, or be doped with a dopant, but is not limited thereto. The buffer layer may be grown in a single-crystal form on the substrate 200. The buffer layer grown in the single-crystal form may improve the crystallinity of a first semiconductor layer 100a grown thereon.

As illustrated in FIG. 6B, in a light-emitting element according to another embodiment, irregularities 110 may be further formed on a surface of a light-emitting structure 100. In FIG. 6B, the irregularities 110 are formed on an upper surface of a first semiconductor layer 100a. The irregularities 110 disperse light emitted from an active layer 100b to improve light efficiency. The irregularities 110 may be evenly or unevenly formed to efficiently disperse light emitted from the active layer 100b.

A light-emitting element according to another embodiment may have a structure in which a light-emitting structure 100 is covered with a molding layer 210 as illustrated in FIG. 6C. In this case, the molding layer 210 may have a single-layer structure as illustrated in FIG. 6C but may be a multi-layer structure. The molding layer 210 may include a fluorescent substance to change a wavelength of light emitted from the light-emitting structure 100 but may not include the fluorescent substance.

In the light-emitting element according to the above embodiment, an entire area of a plurality of contact parts 130a of a first electrode 130 overlaps with a first pad 140a and a second pad 140b in a lengthwise direction of the light-emitting structure 100. That is, since the plurality of contact parts 130a are arranged to be offset with respect to a region between the first pad 140a and the second pad 140b, heat generated in an interfacial region between the first semiconductor layer 100a and the first electrode 130 may be easily discharged via the first pad 140a and the second pad 140b. Furthermore, the heat generated in the interfacial region between the first semiconductor layer 100a and the first electrode 130 may be dispersed via an extension part 130b and thus a heat distribution is uniform in the light-emitting element, thereby improving thermal reliability of the light-emitting element.

FIGS. 7A to 7D are cross-sectional views illustrating a method of manufacturing a light-emitting element according to an embodiment. Here, a method of manufacturing the light-emitting element of FIG. 1B is illustrated.

As illustrated in FIG. 7A, in a light-emitting element according to an embodiment, a light-emitting structure 100 including a first semiconductor layer 100a, an active layer 100b, and a second semiconductor layer 100c is formed on a first substrate 200. The first substrate 200 may be formed of at least one among sapphire (Al2O3), SiC, GaAs, GaN, ZnO, Si, GaP, InP, and Ge but is not limited thereto.

The first substrate 200 may be formed of a material which does not cause warping of the light-emitting structure 100, and may have mechanical strength appropriate to be divided into separate chips using a scribing process and a breaking process.

The first semiconductor layer 100a, the active layer 100b, and the second semiconductor layer 100c may be sequentially formed on the substrate 200 using a method such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), sputtering, or the like. However, methods of forming the first semiconductor layer 100a, the active layer 100b, and the second semiconductor layer 100c are not limited thereto.

The light-emitting structure 100 may be formed in a first region A1 and a second region A2 of the first substrate 200. A contact electrode 130c may be formed to be in contact with the first semiconductor layer 100a. A second electrode 120 may be formed to be in contact with the second semiconductor layer 100c.

In detail, the first semiconductor layer 100a, the active layer 100b, and the second semiconductor layer 100c are mesa-etched to form a groove exposing a part of the first semiconductor layer 100a. The first semiconductor layer 100a, the active layer 100b, and the second semiconductor layer 100c may be etched by wet etching or dry etching.

Then, the contact electrode 130c is formed inside the groove. The contact electrode 130c may be in contact with a bottom surface of the groove (a lower surface of the first semiconductor layer 100a) to be electrically connected to the first semiconductor layer 100a.

Then, the second electrode 120 is formed on a lower surface of the second semiconductor layer 100c. The second electrode 120 is in contact with the lower surface of the second semiconductor layer 100c to be electrically connected to the second semiconductor layer 100c. Although not shown, the second electrode 120 may further include a material making ohmic contact with the second semiconductor layer 100c.

In this case, an order in which the contact electrode 130c and the second electrode 120 are formed may be changed. In particular, when the contact electrode 130c and the second electrode 120 are formed of the same material, they may be formed using the same process but is not limited thereto.

Next, as illustrated in FIG. 7B, a first insulating layer 125, a contact part 130a, an extension part 130b, and a second insulating layer 135 are formed. In detail, an insulating material may be formed to cover the contact electrode 130c and the second electrode 120. Then, the insulating material may be patterned to form the first insulating layer 125 including a first contact hole 125a partially exposing the contact electrode 130c and a second contact hole 125b partially exposing the second electrode 120.

Next, a first electrode 130 may be formed by applying an electrode material on a lower surface of the first insulating layer 125. The extension part 130b may have a thickness which is less than that of the contact electrode 130c to easily discharge heat generated in the light-emitting structure 100. The extension part 130b may be formed in all regions excluding the second contact hole 125b but a location of the extension part 130b is not limited thereto.

Next, an insulating material is formed on lower surfaces of the first electrode 130 and the second electrode 120. Then, the insulating material is selectively patterned to form the second insulating layer 135 including a third contact hole 135a exposing a part of the extension part 130b and a fourth contact hole 135b exposing a region corresponding to the second contact hole 125b of the first insulating layer 125.

Next, as illustrated in FIG. 7C, a second substrate 160 having thereon a first pad 140a, a second pad 140b, and a filling layer 150 may be aligned to the first substrate 200, the first pad 140a and the first electrode 130 may be connected to each other, and then the second pad 140b and the second electrode 120 may be connected to each other.

However, embodiments are not limited thereto, and the first pad 140a and the second pad 140b may be formed and then the filling layer 150 may be formed between the first pad 140a and the second pad 140b.

In this case, an entire area of the contact part 130a overlaps with the first pad 140a and the second pad 140b and thus the contact part 130a is arranged to be offset with respect to a region between the first pad 140a and the second pad 140b.

That is, the contact part 130a is not located in an isolation region between the first pad 140a and the second pad 140b. Thus, heat generated in an interfacial region between the first semiconductor layer 100a and the first electrode 130 may be easily discharged via the first pad 140a and the second pad 140b. Furthermore, the heat generated in the interfacial region between the first semiconductor layer 100a and the first electrode 130 may be dispersed via the extension part 130b, thereby facilitating heat dissipation.

Thereafter, as illustrated in FIG. 7D, the first substrate 200 and the second substrate 160 may be removed to divide the filling layer 150 according to the first region A1 and the second region A2, thereby completing a plurality of light-emitting elements.

In the light-emitting element according to the above described embodiment, an entire interfacial region between the first semiconductor layer 100a and the first electrode 130 completely overlaps with the first pad 140a and the second pad 140b. Thus, heat generated in the interfacial region between the first semiconductor layer 100a and the first electrode 130 may be easily discharged via the first pad 140a and the second pad 140b. Furthermore, the contact part 130a is electrically connected to the extension part 130b and thus heat generated in the light-emitting structure 100 may be dispersed via the extension part 130b. Accordingly, the light-emitting element according to this embodiment has a uniform heat distribution and thus has high thermal reliability.

In one embodiment, the light-emitting element may further include an optical member such as a light guide panel, a prism sheet, or a diffusion sheet and may thus serve as a backlight unit. The light-emitting element according to an embodiment may be also applied to a display device, an illumination device, an indicating device, etc.

In this case, the display device may include a bottom cover, a reflecting plate, a light-emitting module, a light guide panel, an optical sheet, a display panel, an image signal output circuit, and a color filter. The bottom cover, the reflecting plate, the light-emitting module, the light guide panel, and the optical sheet may form a backlight unit together.

The reflecting plate is provided on the bottom cover. The light-emitting module emits light. The light guide panel is provided in front of the reflecting plate and guides light emitted from the light-emitting module in a forward direction. The optical sheet includes a prism sheet or the like and is provided in front of the light guide panel. The display panel is provided in front of the optical sheet. The image signal output circuit supplies an image signal to the display panel. The color filter is provided in front of the display panel.

The illumination device may include an light source module which includes a substrate and a light-emitting element according to an embodiment, a light dissipater which radiates heat from the light source module, and a power supply which processes or converts an electrical signal received from the outside and provides a result of processing or converting the electrical signal to the light source module. Examples of the illumination device may include a lamp, a head lamp, a street lamp, etc.

The present invention is not limited to the embodiments set forth herein and the accompanying drawings. It will be apparent to those of ordinary skill in the art that various replacements, modifications, or changes may be made in the present invention without departing from the technical ideas of embodiments.

The invention claimed is:

1. A light-emitting element comprising:
   a light-emitting structure including a first semiconductor layer, an active layer, and a second semiconductor layer;
   a first electrode disposed at a lower portion of the light-emitting structure and including a plurality of contact parts electrically connected to the first semiconductor layer;
   a second electrode formed at the side disposed at the lower portion of the light-emitting structure and electrically connected to the second semiconductor layer;
   a first pad disposed at a lower portion of the first electrode and connected to the first electrode; and
   a second pad disposed at a lower portion of the second electrode and connected to the second electrode to be spaced from the first pad,
   wherein the light-emitting structure comprises a plurality of recesses formed up to a portion of the first semiconductor layer by extending through the second semiconductor layer and the active layer,
   wherein the plurality of contact parts is electrically connected to the first semiconductor layer via the plurality of recesses, and
   wherein all of the plurality of contact parts overlap the first pad and the second pad in a thickness direction of the first semiconductor layer.

2. The light-emitting element of claim 1, wherein the first electrode comprises:
   the plurality of contact parts; and
   an extension part connected to the plurality of contact parts, and
   wherein the extension part is connected to the first pad.

3. The light-emitting element of claim 2, wherein the first electrode comprises a contact electrode arranged between the first semiconductor layer and the plurality of contact parts.

4. The light-emitting element of claim 3, wherein the contact electrode comprises a material having a lower contact resistance with respect to the first semiconductor layer than the plurality of contact parts and the extension part.

5. The light-emitting element of claim 3, wherein the extension part has a thickness which is less than that of the contact electrode.

6. The light-emitting element of claim 1, further comprising:
   a first insulating layer configured to partially expose the first semiconductor layer; and
   a second insulating layer arranged between the first electrode and the second pad.

7. The light-emitting element of claim 6, wherein the plurality of contact parts are connected to the first semiconductor layer exposed by the first insulating layer, and
   wherein the first pad is connected to the first electrode via a third contact hole passing through the second insulating layer.

8. The light-emitting element of claim 6, wherein the second pad is connected to the second electrode exposed via a second contact hole passing through the first insulating layer and a fourth contact hole passing through the second insulating layer.

9. The light-emitting element of claim 8, wherein the second contact hole and the fourth contact hole overlap each other.

10. The light-emitting element of claim 1, wherein the plurality of contact parts are arranged to be offset with respect to a region between the first pad and the second pad, when viewed from a plan view.

11. The light-emitting element of claim 1, wherein the plurality of contact parts have a shape selected from among a dot shape and a line shape.

12. The light-emitting element of claim 1, further comprising a filling layer arranged in an isolation region between the first pad and the second pad.

13. A light-emitting element comprising:
   a light-emitting structure including a first semiconductor layer, an active layer, and a second semiconductor layer;
   a first electrode disposed at a lower portion of the light-emitting structure and including a plurality of contact parts electrically connected to the first semiconductor layer;
   a second electrode disposed at the lower portion of the light-emitting structure and electrically connected to the second semiconductor layer;
   a first pad connected to the first electrode;
   a second pad connected to the second electrode to be spaced from the first pad;
   a first insulating layer configured to partially expose the first semiconductor layer; and
   a second insulating layer arranged between the first electrode and the second pad,
   wherein the plurality of contact parts are arranged on the first pad and the second pad,
   wherein the second pad is connected to the second electrode exposed via a second contact hole passing through the first insulating layer and a fourth contact hole passing through the second insulating layer, and
   wherein the second contact hole and the fourth contact hole overlap each other.

14. The light-emitting element of claim 13, wherein the plurality of contact parts and an area between the first pad and the second pad in a thickness direction of the first conductive semiconductor are misaligned.

* * * * *